United States Patent
Liu et al.

(10) Patent No.: US 9,070,813 B2
(45) Date of Patent: Jun. 30, 2015

(54) METHOD FOR DETECTING POLARIZED LIGHT

(71) Applicants: Tsinghua University, Beijing (CN); HON HAI PRECISION INDUSTRY CO., LTD., New Taipei (TW)

(72) Inventors: Jun-Ku Liu, Beijing (CN); Guan-Hong Li, Beijing (CN); Qun-Qing Li, Beijing (CN); Shou-Shan Fan, Beijing (CN)

(73) Assignees: Tsinghua University, Beijing (CN); HON HAI PRECISION INDUSTRY CO., LTD., New Taipei (TW)

( * ) Notice: Subject to any disclaimer, the term of this patent is extended or adjusted under 35 U.S.C. 154(b) by 216 days.

(21) Appl. No.: 13/858,728

(22) Filed: Apr. 8, 2013

(65) Prior Publication Data

US 2014/0217262 A1    Aug. 7, 2014

(30) Foreign Application Priority Data

Feb. 4, 2013    (CN) .......................... 2013 1 0042255

(51) Int. Cl.
  *G01J 1/44*    (2006.01)
  *H01L 31/09*    (2006.01)
(52) U.S. Cl.
  CPC ...................... *H01L 31/09* (2013.01)
(58) Field of Classification Search
  CPC ........ B82Y 30/00; B82Y 10/00; B82Y 15/00; H01L 27/1465; H01L 31/09; H01L 31/115; H01L 31/035209; H01L 31/0224; H01L 31/022466; H01L 51/0048; G01N 21/215; G01D 5/344; G01D 5/345; G01J 4/04; H01M 4/04
  USPC .......... 257/428, 431, 432; 977/701, 720, 742; 338/15–19
  See application file for complete search history.

(56) References Cited

U.S. PATENT DOCUMENTS

| 4,724,338 | A | * | 2/1988 | Hoffmann et al. | ............ 327/187 |
| 8,269,169 | B1 | * | 9/2012 | Sinton et al. | ............... 250/338.1 |
| 2009/0279390 | A1 | * | 11/2009 | Jiang et al. | .................... 367/140 |
| 2010/0245808 | A1 | * | 9/2010 | Xiao et al. | ..................... 356/218 |
| 2014/0217536 | A1 | * | 8/2014 | Liu et al. | ........................ 257/432 |
| 2014/0218161 | A1 | * | 8/2014 | Liu et al. | ......................... 338/15 |

* cited by examiner

*Primary Examiner* — Renee D Chavez
(74) *Attorney, Agent, or Firm* — Novak Druce Connolly Bove + Quigg LLP

(57) ABSTRACT

A method for detecting polarized light is disclosed. Providing a polarized light detection system including a photoresistor, a power source and a detection apparatus. The photoresistor includes a first electrode layer and a photosensitive material layer. The detection apparatus includes a current detection device and a computer analysis system. An incident light is irradiated onto a surface of the photoresistor. Polarization information of the incident light is identified by the photoresistor. Current change in the photoresistor is detected by the current detection device. The polarization information of the incident light is analyzed by the computer analysis system.

13 Claims, 6 Drawing Sheets

METHOD FOR DETECTING POLARIZED LIGHT

CROSS-REFERENCE TO RELATED APPLICATIONS

This application claims all benefits accruing under 35 U.S.C. §119 from China Patent Application No. 201310042255.X, filed on Feb. 4, 2013 in the China Intellectual Property Office. This application is also related to the applications entitled, "PHOTORESISTOR", filed Apr. 8, 2013 Ser. No. 13/858,722 and entitled "POLARIZED LIGHT DETECTION SYSTEM", filed Apr. 8, 2013 Ser. No. 13/858,735. Disclosures of the above-identified applications are incorporated herein by reference.

BACKGROUND

1. Technical Field

The present disclosure relates to methods for detecting polarized light.

2. Description of Related Art

Detection of polarized light needs particular polarized light detection system. In some related arts, a polarized light detection system includes a photoresistor, a detection apparatus, a power source, and an external polarizing element. The external polarizing element is used to identify polarization information of an incident light. The photoresistor accompanied with the detection apparatus is used to detect intensity and distribution information of the incident light. Due to the setting of external polarizing element, it is more complicated to detect a polarized light than to detect a common light.

Additionally, in some related arts, a photoresistor includes an active semiconductor layer deposited on an insulating substrate, and two metal contacts placed separately on the exposed area of the semiconductor layer. To ensure the resistance changes resulting from the light dominate, the resistance of the two metal contacts is minimized. To achieve this, the area between the two metal contacts is in the form of a zigzag or interdigital pattern. This keeps the distance between the two metal contacts small, which reduces the resistance and enhances the carriers gain.

However, due to that the metal contacts are impenetratable by light, the exposed area of the semiconductor is still small and the sensitivity of the photoresistor to the weak light is low.

What is needed, therefore, is to provide a simplified polarized light detection system and a method for detecting polarized light without external polarizing element.

BRIEF DESCRIPTION OF THE DRAWINGS

Many aspects of the present disclosure can be better understood with reference to the following drawings. The components in the drawings are not necessarily to scale, the emphasis instead being placed upon clearly illustrating the principles of the present embodiments.

DETAILED DESCRIPTION

The disclosure is illustrated by way of example and not by way of limitation in the figures of the accompanying drawings in which like references indicate similar elements. It should be noted that references to "another," "an," or "one" embodiment in this disclosure are not necessarily to the same embodiment, and such references mean at least one.

Figure 1:
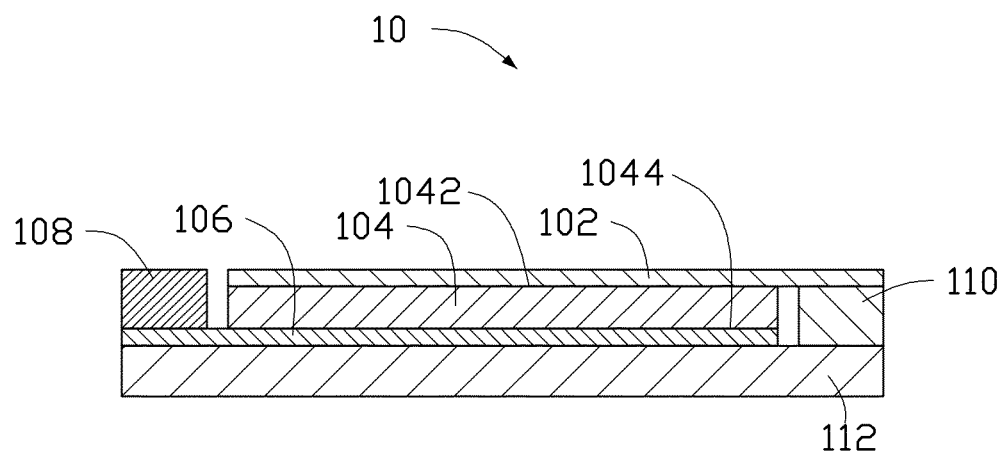
FIG. 1 is a schematic diagram of a photoresistor according to one embodiment.

Referring to FIG. 1, a photoresistor 10 of one embodiment includes a first electrode layer 102, a photosensitive material layer 104, and a second electrode layer 106. The first electrode layer 102, photosensitive material layer 104 and second electrode layer 106 are stacked with each other. The photosensitive material layer 104 has a first surface 1042, a second surface 1044 opposite to the first surface 1042, and at least one side surface connecting the first surface 1042 to the second surface 1044. The first electrode layer 102 is attached to the first surface 1042 of the photosensitive material layer 104; and the second electrode layer 106 is attached to the second surface 1044 of the photosensitive material layer 104. The first electrode layer 102 and second electrode layer 106 are electrically contacted to the photosensitive material layer 104.

In one embodiment, the first electrode layer 102 and second electrode layer 106 cover the entire first surface 1042 and the entire second surface 1044, respectively. In another embodiment, the first electrode layer 102 and second electrode layer 106 cover parts of the first surface 1042 and parts of the second surface 1044, respectively.

According to one embodiment, the photoresistor 10 further includes a first lead-out electrode 110 and a second lead-out electrode 108. The first lead-out electrode 110 and second lead-out electrode 108 are separately configured. The first lead-out electrode 110 is electrically contacted to the first electrode layer 102, and the second lead-out electrode 108 is electrically contacted to the second electrode layer 106. Furthermore, the first lead-out electrode 110 is isolated from the photosensitive material layer 104 and second electrode layer 106. The second lead-out electrode 108 is isolated from the photosensitive material layer 104 and first electrode layer 102.

According to another embodiment, the photoresistor 10 includes an insulating substrate 112. The substrate 112 is used to support the whole photoresistor 10. The second electrode layer 106 and first lead-out electrode 110 are separately located on a surface of the substrate 112. The second lead-out electrode 108 and photosensitive material layer 104 are separately located on a surface of the second electrode layer 106. The first electrode layer 102 is simultaneously located on the first surface 1042 of the photosensitive material layer 104 and a surface of the first lead-out electrode 110.

The photosensitive material layer 104 is made of a semiconductor. The semiconductor can be cadmium sulphide, lead sulphide, aluminium sulphide, bismuth sulphide, germanium, selenium, silicon, or gallium arsenide. In one embodiment, the photosensitive material layer 104 is made of cadmium sulphide.

The thickness of the photosensitive material layer 104 is in a range from about 5 microns to about 500 microns. In one embodiment, the thickness of the photosensitive material layer 104 ranges from about 5 microns to about 150 microns. In another embodiment, the thickness of the photosensitive material layer 104 ranges from about 5 microns to about 50 microns. When the photosensitive material layer 104 has a smaller thickness, the carriers excited by photons need to step over a smaller gap between the two electrode layers. The light sensitivity of the photoresistor 10 is improved because fewer carriers are loss.

Figure 2:
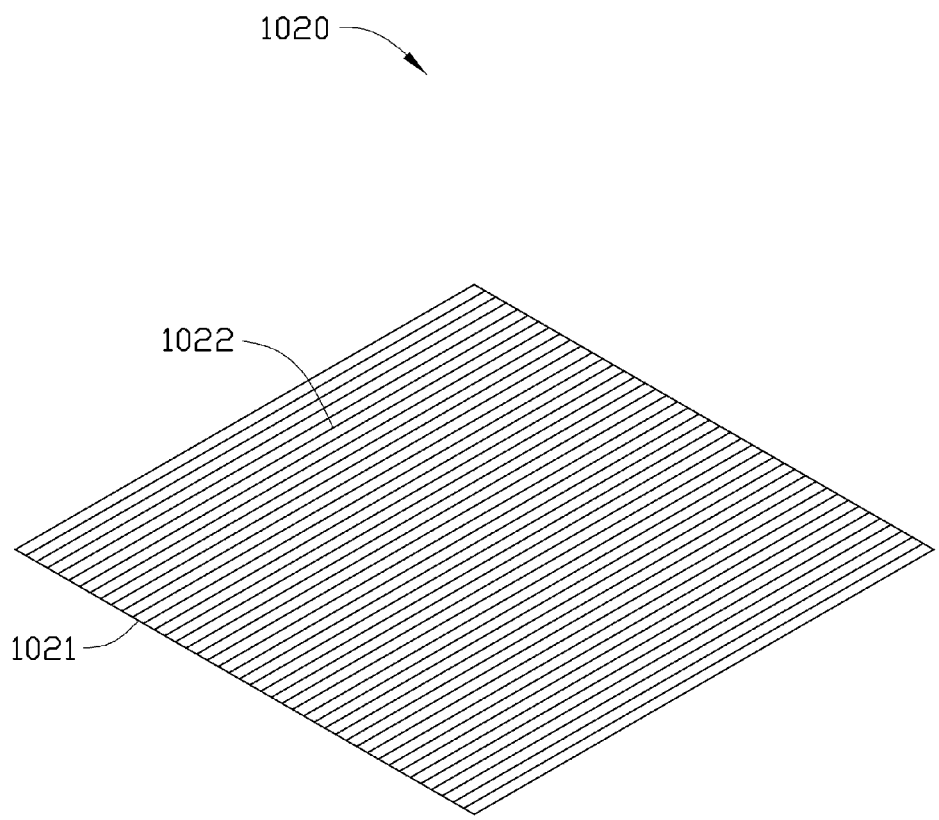
FIG. 2 is an exploded view of a carbon nanotube film structure used in the photoresistor of FIG. 1.

Referring to FIG. 2, the first electrode layer 102 is a transparent conductive electrode, which includes a carbon nanotube film structure 1020. In one embodiment, the first electrode layer 102 consists of the carbon nanotube film structure 1020.

The carbon nanotube film structure 1020 is a flexible and free-standing structure. The term "free-standing structure" can be defined as a structure that does not have to be supported by a substrate and can sustain the weight itself when it is hoisted by a portion thereof without tearing. The thickness of the carbon nanotube film structure 1020 is in a range from about 1 nanometer to about 50 microns. In one embodiment, the thickness of the carbon nanotube film structure 1020 ranges from about 0.5 microns to about 5 microns. The carbon nanotube film structure 1020 includes a plurality of evenly distributed carbon nanotubes 1022. In one embodiment, the carbon nanotube film structure 1020 consists of the plurality of carbon nanotubes 1022. The adjacent carbon nanotubes 1022 in the carbon nanotube film structure 1020 are joined by van der Waals attractive force therebetween. The plurality of carbon nanotubes 1022 in the carbon nanotube film structure 1020 is substantially aligned along a single preferred direction. The carbon nanotubes 1022 can be single-walled carbon nanotubes, double-walled carbon nanotubes, or multi-walled carbon nanotubes.

Figure 3:
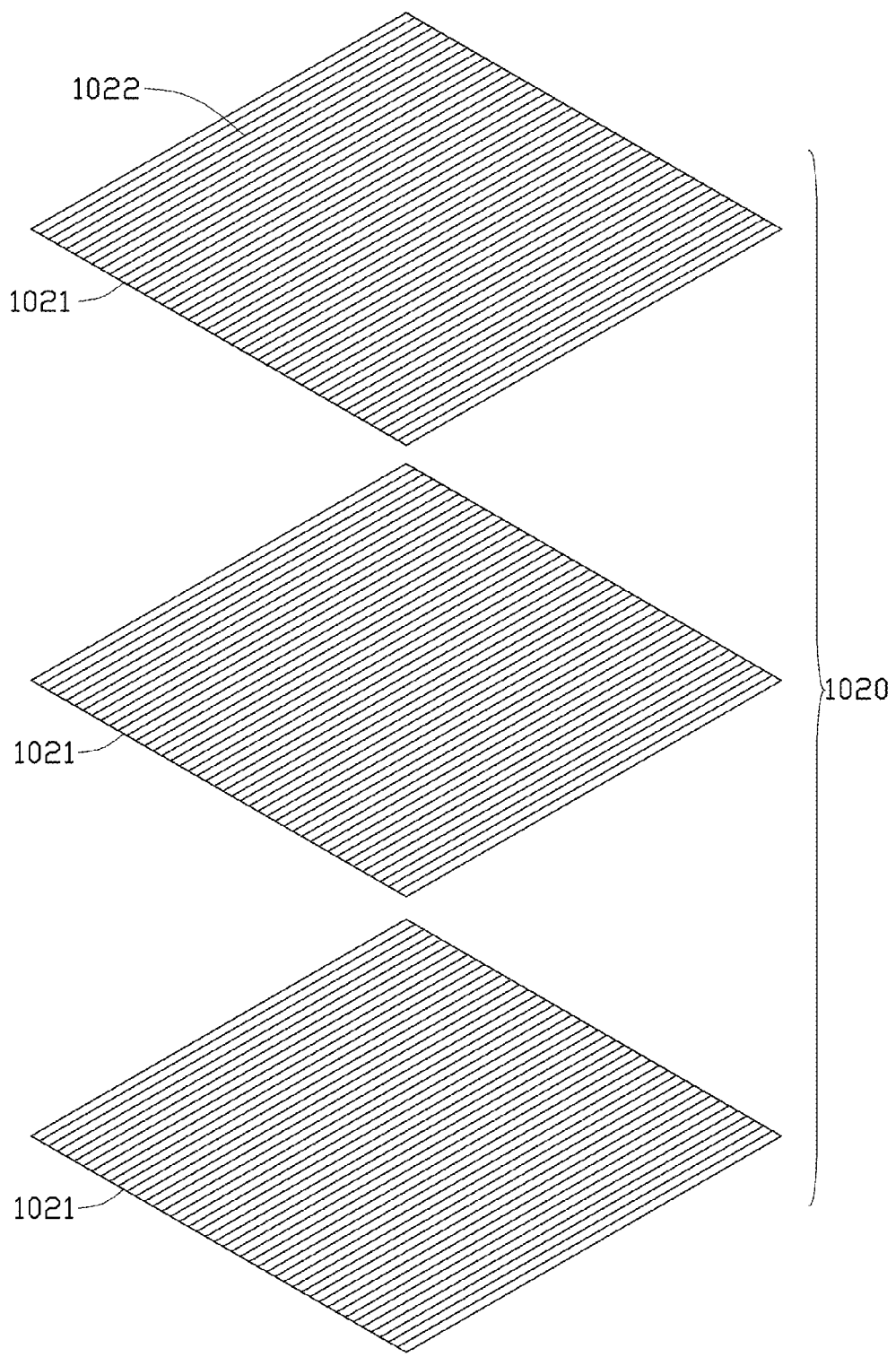
FIG. 3 is an exploded view of another carbon nanotube film structure used in the photoresistor of FIG. 1.
Figure 4:
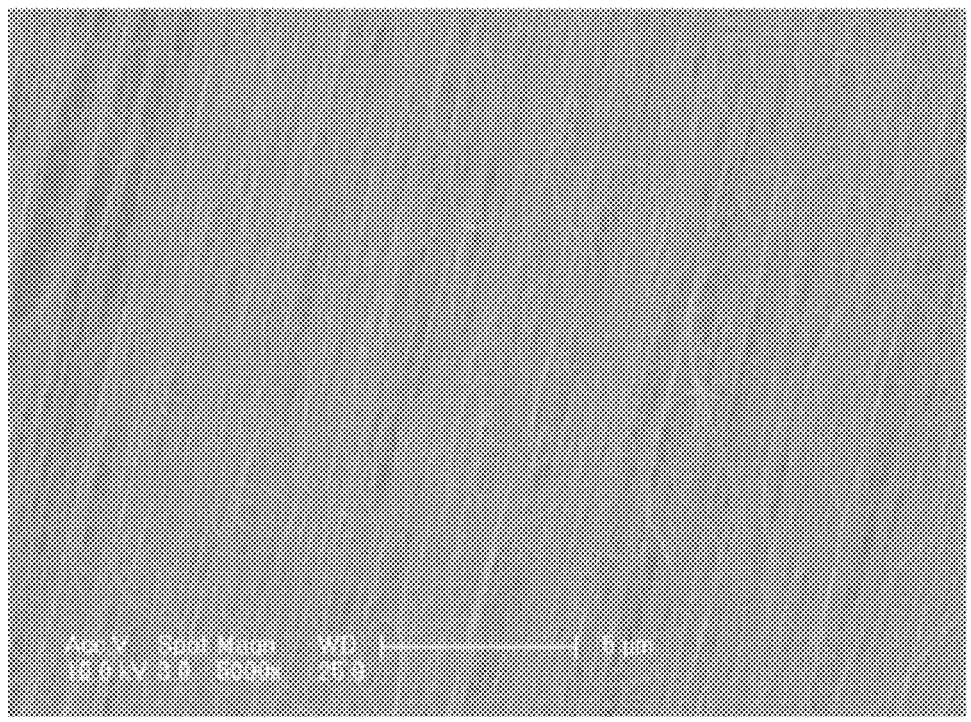
FIG. 4 is a scanning electron microscopy (SEM) picture of a single-layer carbon nanotube drawn film used in the photoresistor of FIG. 1.

Referring to FIG. 3 to FIG. 4, the carbon nanotube film structure 1020 includes at least one carbon nanotube drawn film 1021. The carbon nanotube drawn film 1021 is a freestanding structure including a plurality of successive and oriented carbon nanotubes 1022. The carbon nanotubes 1022 in the carbon nanotube drawn film 1021 are arranged substantially parallel to a surface of the carbon nanotube drawn film 1021. The plurality of carbon nanotubes 1022 are joined end to end by van der Waals attractive force therebetween. If the carbon nanotube film structure 1020 consists of a plurality of carbon nanotube drawn films 1021 stacked with each other, all of the carbon nanotubes 1022 in the carbon nanotube drawn films 1021 are substantially aligned along a single preferred direction.

The carbon nanotube drawn film 1021 has a light transmittance ranges from about 80% to about 90%. If the carbon nanotube film structure 1020 consists of a plurality of carbon nanotube drawn films 1021 stacked with each other, a light transmittance of the carbon nanotube film structure 1020 will decrease gradually. According to one embodiment, the carbon nanotube film structure 1020 consists of two carbon nanotube drawn films 1021, and the light transmittance decreases to about 70% to about 80%. Thus, the number of the carbon nanotube drawn films 1021 in the carbon nanotube film structure 1020 is less than 5. In one embodiment, the number of the carbon nanotube drawn films 1021 in the carbon nanotube film structure 1020 is less than 3.

To improve the light transmittance of the carbon nanotube drawn film 1021, a laser treatment for reducing the thickness of the carbon nanotube drawn film 1021 can be applied. According to one embodiment, the light transmittance of the carbon nanotube drawn film 1021 increases to 95% or greater than 95% after the laser treatment. In one embodiment, a power density of a laser is greater than $0.1 \times 10^4$ W/m$^2$, a diameter of an irradiating pattern of the laser approximately ranges from 1 micron to 5 millimeters, wherein a time of laser irradiation is less than 1.8 s.

The carbon nanotube drawn film 1021 can be formed by the steps of:
(a) providing an array of carbon nanotubes or a super-aligned array of carbon nanotubes;
(b) selecting a plurality of carbon nanotube segments having a predetermined width from the array of carbon nanotubes; and
(c) pulling the carbon nanotube segments at an even speed to form a carbon nanotube drawn film.

In step (a), the super-aligned array of carbon nanotubes can be formed by substeps of:
(a1) providing a substantially flat and smooth substrate;
(a2) forming a catalyst layer on the substrate;
(a3) annealing the substrate with the catalyst layer in air at a temperature ranging from 700° C. to 900° C. for about 30 minutes to 90 minutes;
(a4) heating the substrate with the catalyst layer at a temperature ranging from 500° C. to 740° C. in a furnace in protective gas; and
(a5) supplying a carbon source gas to the furnace for about 5 minutes to 30 minutes and growing a super-aligned array of carbon nanotubes from the substrate.

The super-aligned array of carbon nanotubes can be approximately 50 microns to 900 microns in height, and includes a plurality of carbon nanotubes parallel to each other and substantially perpendicular to the substrate. The super-aligned array of carbon nanotubes formed under the above conditions is essentially free of impurities, such as carbonaceous or residual catalyst particles. The carbon nanotubes in the super-aligned array are closely packed together by van der Waals attractive force.

In step (b), the carbon nanotube segments having a predetermined width can be selected using an adhesive tape to contact with the super-aligned array.

In step (c), the pulling direction is substantially perpendicular to the growing direction of the super-aligned array of carbon nanotubes. Specifically, during the pulling process, as the initial carbon nanotube segments are drawn out, other carbon nanotube segments are also drawn out end to end due to the van der Waals attractive force between ends of adjacent segments. This process of drawing ensures a successive carbon nanotube drawn film having a predetermined width can be formed.

The second electrode layer 106 can be the same as the first electrode layer, which consists of a carbon nanotube film structure 1020. The second electrode layer 106 can also consist of a metal film or an ITO film. If the second electrode layer 106 consists of the carbon nanotube film structure 1020, the photoresistor 10 can be a flexible structure as a whole. If the second electrode layer 106 consists of the metal film, the second electrode layer 106 can reflect an incident light and then improve the light sensitivity of the photoresistor 10. The metal film can be made of aluminum, copper, silver, gold, or their alloys. In one embodiment, the metal film is a copper film.

Both the first lead-out electrode 110 and second lead-out electrode 108 can be made of metals such as silver, copper, and aluminum. The first lead-out electrode 110 and second lead-out electrode 108 can also be made of ITO or carbon nanotubes. The first lead-out electrode 110 and second lead-out electrode 108 can be but not limited to wire-shaped, stripe-shaped, or plate-shaped. In one embodiment, both the first lead-out electrode 110 and second lead-out electrode 108 are aluminum wires. In one embodiment, the first lead-out electrode 110 is located on one end of the first electrode layer 102 along the single preferred direction of the carbon nanotubes 1022. In another embodiment, the second electrode layer 106 consists of a carbon nanotube film structure 1020, and the second lead-out electrode 108 is located on one end of the second electrode layer 106 along the single preferred direction of the carbon nanotubes 1022.

The insulating substrate 112 can be made of flexible polymers such as polyethylene terephthalate (PET), polymethyl methacrylate (PMMA), polycarbonate (PC), and polyethylene (PE). The insulating substrate 112 can also be made of glasses, silicon, silicon oxide, silicon carbide, or other rigid materials. The thickness of the insulating substrate 112 is not limited. In one embodiment, the insulating substrate 112 is a PET film with a thickness of about 200 microns.

The transparent carbon nanotube film structure 1020 used as the first electrode layer 102 of the photoresistor 10 can increase the exposed area of the photosensitive material layer 104 to light and then increase the light received by the photoresistor 10, and thus improve the light sensitivity of the photoresistor 10. Furthermore, because the carbon nanotubes 1022 are substantially aligned along a single direction, the carbon nanotube film structure 1020 is anisotropic in some properties such as the light transmittance. The transmittance of the carbon nanotube film structure 1020 to a polarized light whose polarization direction is parallel to the single direction of the carbon nanotubes 1022 is smaller than the transmittance to a polarized light whose polarization direction is perpendicular to the single direction of the carbon nanotubes 1022. The carbon nanotube film structure 1020 can thus also be used as a polarizing element in the photoresistor 10. Therefore, the photoresistor 10 can be used to detect the polarized light.

Figure 5:
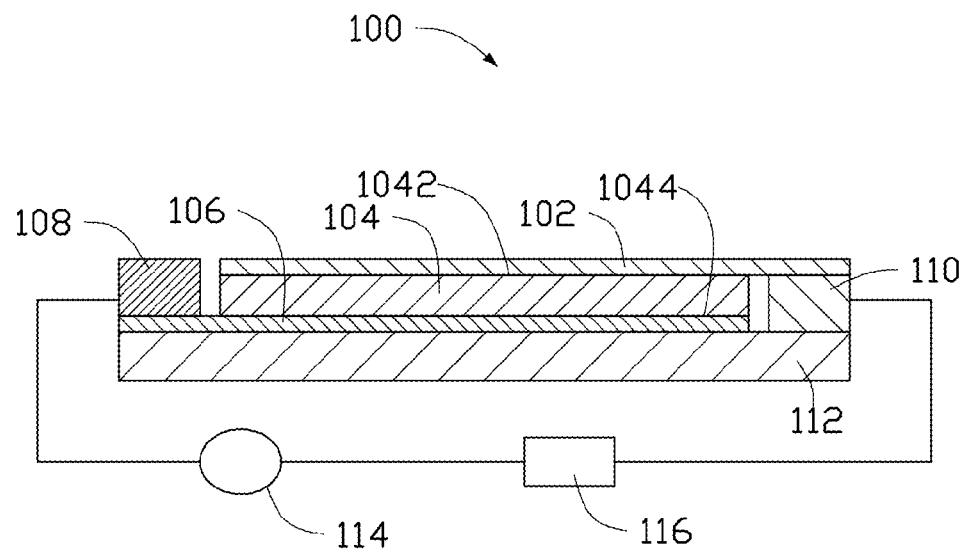
FIG. 5 is schematic diagram of a polarized light detection system incorporating the photoresistor of FIG. 1.

Referring to FIG. 5, a polarized light detection system 100 according to one embodiment includes a photoresistor 10, a power source 114, and a detection apparatus 116. The photoresistor 10, power source 114 and detection apparatus 116 are electrically connected with wires to form a galvanic circle.

The power source 114 is a direct current power source with a voltage between 0.01 V to 2 V.

The detection apparatus 116 includes a current detection device such as an amperemeter to detect a fluctuation of the photoresistor 10. The detection apparatus 116 can further include a computer analysis system to analyze the polarization information of an incident light.

Figure 6:
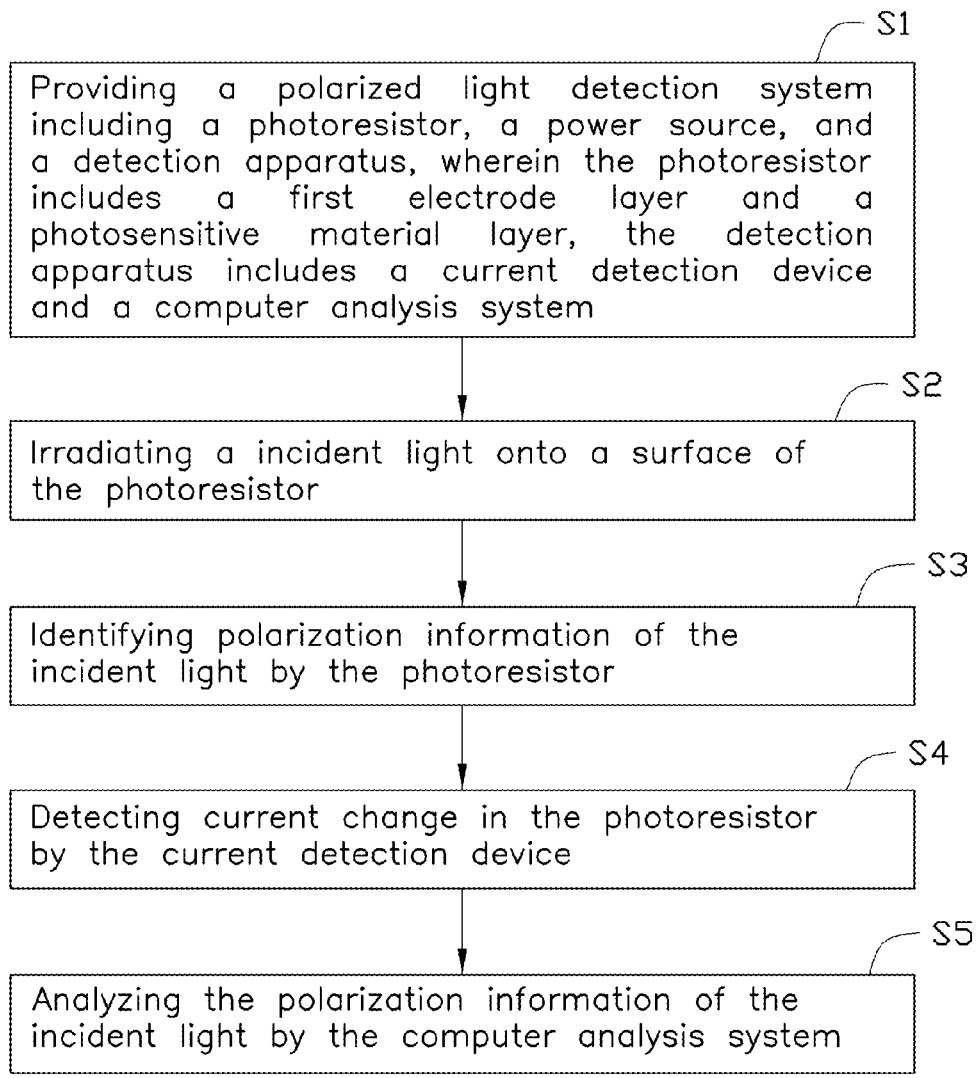
FIG. 6 is flowchart of method for detecting a polarized light using the polarized light detection system of FIG. 5.

Referring to FIG. 6, a method for detecting polarized light of one embodiment includes steps of:

S1, providing a polarized light detection system 100 including a photoresistor 10, a power source 114, and a detection apparatus 116, wherein the photoresistor 10 includes a first electrode layer 102 and a photosensitive material layer 104, the detection apparatus 116 includes a current detection device and a computer analysis system;

S2, irradiating an incident light onto a surface of the photoresistor 10; S3, identifying polarization information of the incident light by the photoresistor 10;

S4, detecting current change in the photoresistor 10 by the current detection device; and S5, analyzing the polarization information of the incident light by the computer analysis system.

In step S1, the photoresistor 10, power source 114 and detection apparatus 116 are electrically connected with wires to form a galvanic circle.

In step S2, the incident light is irradiated onto a surface of the first electrode layer 102.

In step S3, the identification of polarization information of the incident light is executed through adjusting the position and direction relationships between the photoresistor 10 and light source of the incident light. One way of adjusting the position and direction relationships is to rotate one of the photoresistor 10 and light source while maintaining the distance unchanged.

In step S4, the instant value of current relates to the transmittance to the incident light of the first electrode layer 102. Smaller current value responds to smaller transmittance of the incident light. Therefore, when the current in the photoresistor 10 decreases to a minimum value, the transmittance to the incident light of the first electrode layer 102 goes to a minimum value also. This indicates that a polarization direction of the incident light is parallel to the single direction along which the carbon nanotubes 1022 in the carbon nanotube film structure 1020 aligned in the first electrode layer 102. Alternatively, when the current in the photoresistor 10 increases to a maximum value, the transmittance to the incident light of the first electrode layer 102 goes to a maximum value too. This indicates that a polarization direction of the incident light is perpendicular to the single direction along which the carbon nanotubes 1022 in the carbon nanotube film structure 1020 aligned in the first electrode layer 102.

The method as disclosed in FIG. 6 can be used to detect polarized light, and also be used to detect weak light, mainly because of the transparency and anisotropy features of the carbon nanotube film structure 1020 in the first electrode layer 102 of the photoresistor 10.

It is to be understood that the above-described embodiment is intended to illustrate rather than limit the disclosure. Variations may be made to the embodiment without departing from the spirit of the disclosure as claimed. The above-described embodiments are intended to illustrate the scope of the disclosure and not restricted to the scope of the disclosure.

It is also to be understood that the above description and the claims drawn to a method may include some indication in reference to certain steps. However, the indication used is only to be viewed for identification purposes and not as a suggestion as to an order for the steps.

What is claimed is:

1. A method for detecting polarized light comprising:
   (a) providing a polarized light detection system comprising a photoresistor, a power source, and a detection apparatus; wherein the photoresistor comprises a first electrode layer and a photosensitive material layer, and the detection apparatus comprises a current detection device and a computer analysis system;
   (b) irradiating an incident light onto a photoresistor surface;
   (c) identifying polarization information of the incident light by the photoresistor;
   (d) detecting current change in the photoresistor by the current detection device; and
   (e) analyzing the polarization information of the incident light by the computer analysis system;
   wherein in step (a), the photoresistor further comprises a second electrode layer comprising a carbon nanotube film structure that is a flexible and free-standing structure comprising a plurality of carbon nanotubes;
   wherein in step (c), the identifying polarization information of the incident light comprises adjusting position and direction relationships between the photoresistor and a light source of the incident light.

2. The method as claimed in claim 1, wherein in step (a), the photoresistor, the power source and the detection apparatus are electrically connected with wires to form a galvanic circle.

3. The method as claimed in claim 1, wherein in step (a), the first electrode layer comprises a carbon nanotube film structure that is a flexible and free-standing structure comprises a plurality of carbon nanotubes.

4. The method as claimed in claim 3, wherein the plurality of carbon nanotubes are joined by van der Waals attractive force therebetween and substantially aligned along a single preferred direction.

5. The method as claimed in claim 3, wherein the carbon nanotube film structure comprises at least one carbon nanotube drawn film comprising a plurality of successive and oriented carbon nanotubes joined end to end by van der Waals attractive force therebetween.

6. The method as claimed in claim 5, wherein the at least one carbon nanotube drawn film has a light transmittance ranging from about 80% to about 90%.

7. The method as claimed in claim 5, wherein the at least one carbon nanotube drawn film comprises two carbon nanotube drawn films stacked with each other and the carbon nanotube film structure has a light transmittance ranging from about 70% to about 80%.

8. The method as claimed in claim 1, wherein the first electrode layer, the photosensitive material layer and the second electrode layer are stacked with each other to form a sandwich structure.

9. The method as claimed in claim 8, wherein the second electrode layer comprises a metal film.

10. The method as claimed in claim 8, wherein the photoresistor further comprises a first lead-out electrode and a second lead-out electrode, the first lead-out electrode and second lead-out electrode are separately disposed from each other; and the first lead-out electrode is electrically connected to the first electrode layer, and the second lead-out electrode is electrically connected to the second electrode layer.

11. The method as claimed in claim 1, wherein in step (a), the photosensitive material layer has a thickness ranging from about 5 microns to about 500 microns.

12. The method as claimed in claim 11, wherein the photosensitive material layer has a thickness ranging from about 5 microns to about 50 microns.

13. The method as claimed in claim 1, wherein in step (b), the incident light is irradiated onto a first electrode layer surface.

* * * * *